United States Patent
Mikuni et al.

(10) Patent No.: US 9,110,098 B2
(45) Date of Patent: Aug. 18, 2015

(54) PROBE CARD AND TESTING APPARATUS

(71) Applicant: Kabushiki Kaisha Nihon Micronics, Tokyo (JP)

(72) Inventors: Katsushi Mikuni, Hirosaki (JP); Yoshinori Kikuchi, Hirosaki (JP); Yoshihito Onuma, Minamitsugaru (JP); Toshiyuki Kudo, Hirosaki (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 189 days.

(21) Appl. No.: 13/930,658

(22) Filed: Jun. 28, 2013

(65) Prior Publication Data

US 2014/0028341 A1    Jan. 30, 2014

(30) Foreign Application Priority Data

Jul. 25, 2012 (JP) .................. 2012-165041

(51) Int. Cl.
*G01R 31/00* (2006.01)
*G01R 1/073* (2006.01)
*G01R 31/28* (2006.01)

(52) U.S. Cl.
CPC ........ *G01R 1/07307* (2013.01); *G01R 1/07378* (2013.01); *G01R 31/2889* (2013.01)

(58) Field of Classification Search
CPC ........... G01R 1/07307; G01R 1/07378; G01R 31/2889
USPC .................. 324/703, 750.11, 754.01–754.03, 324/754.07, 756.01, 756.03, 764.01
See application file for complete search history.

(56) References Cited

U.S. PATENT DOCUMENTS

| | | | |
|---|---|---|---|
| 7,325,304 B2 * | 2/2008 | Narazaki et al. | 29/876 |
| 8,278,965 B2 * | 10/2012 | Washio et al. | 324/764.01 |
| 2002/0113608 A1 * | 8/2002 | Chen | 324/754 |
| 2002/0118029 A1 * | 8/2002 | Yamasaka | 324/754 |
| 2005/0110155 A1 * | 5/2005 | Horii | 257/773 |
| 2007/0235881 A1 * | 10/2007 | Horii | 257/773 |
| 2009/0160469 A1 * | 6/2009 | Miura et al. | 324/755 |
| 2010/0327898 A1 * | 12/2010 | Ishigaki et al. | 324/756.03 |
| 2012/0229160 A1 * | 9/2012 | Ono et al. | 324/756.07 |

FOREIGN PATENT DOCUMENTS

| | | |
|---|---|---|
| JP | 2010-025765 | 2/2010 |
| JP | 2011-007743 | 1/2011 |

* cited by examiner

*Primary Examiner* — Tung X Nguyen
*Assistant Examiner* — Raul Rios Russo
(74) *Attorney, Agent, or Firm* — Procopio, Cory, Hargreaves & Savitch LLP

(57) ABSTRACT

Provided is a probe card capable of effectively placing electronic parts. A probe card according to the present invention includes a plurality of probes that come into contact with a plurality of electrodes of a device, a probe board including the plurality of probes provided thereon, a wiring board that is placed facing a surface of the probe board opposite to a surface including the probes provided thereon, a connector that includes a connection pin and a holder, in which the connection pin electrically connects a line of the probe board and a line of the wiring board, and the holder holds the connection pin between the probe board and the wiring board, and a first electronic part that is mounted on a probe board side surface of the wiring board and placed in a mounting space formed by a through hole or a recess provided in the holder.

7 Claims, 8 Drawing Sheets

PROBE CARD AND TESTING APPARATUS

This application is based upon and claims the benefit of priority from Japanese patent application No. 2012-165041, filed on Jul. 25, 2012 the disclosure of which is incorporated herein in its entirety by reference.

BACKGROUND OF THE INVENTION

1. Field of the Invention

The present invention relates to a probe card and a testing apparatus, and particularly to a probe card including electronic parts and a testing apparatus using the same.

2. Description of Related Art

A probe card is used for testing semiconductor devices and the like. For example, a plurality of probes mounted on a probe card come into contact with electrodes (pads) of a semiconductor device to enable a tester to supply power and the like to the semiconductor device.

Further, probe cards including electronic parts such as relay switches have been developed. For example, Japanese Unexamined Patent Application Publication No. 2011-7743 discloses a probe card including relay switches. Power from a tester can be supplied or interrupted by controlling the relay switch to be turned on or off. By interrupting the power supply to a faulty chip with overcurrent, it is possible to test other normal chips appropriately.

Furthermore, Japanese Unexamined Patent Application Publication No. 2010-25765 discloses a probe card including probes and electronic parts mounted on a lower surface of a connection structure. Japanese Unexamined Patent Application Publication No. 2010-25765 exemplifies, as the electronic parts, a capacitor, termination resistor, diode, IC, and LSI (paragraph 0030).

However, the probe card has a limited space for mounting the electronic parts. For example, as disclosed in Japanese Unexamined Patent Application Publication No. 2010-25765, the height of electronic parts to be mounted is limited on the surface where the probes are provided. For example, it is difficult to mount electronic parts with their height being greater than that of the probes. The number of electronic parts such as relay switches increases along with the increase in the number of power supplies, thereby limiting the space to place the electronic parts. This makes it difficult to effectively place the electronic parts.

The present invention is made in view of the above-mentioned issue, and an object is to provide a probe card and a testing apparatus capable of effectively placing electronic parts.

SUMMARY OF THE INVENTION

An exemplary aspect of the present invention is a probe card including a plurality of probes that come into contact with a plurality of electrodes of a device under test, a probe board that includes the plurality of probes provided thereon, a wiring board that is placed facing a surface of the probe board opposite to a surface including the probes provided thereon, a connector that includes a connection pin and a holder, in which the connection pin electrically connects a line of the probe board and a line of the wiring board, and the holder holds the connection pin between the probe board and the wiring board, and a first electronic part that is mounted on a probe board side surface of the wiring board and placed in a mounting space, in which the mounting space is formed by a through hole or a recess provided in the holder. This achieves efficient use of the space on the lower surface of the wiring board, thereby effectively placing the electronic parts.

In the above probe card, the first electronic part may be a relay switch that interrupts power supply to the device under test.

In the above probe card, it is preferable to mount a second electronic part at a position facing the first electronic part on a wiring board side surface of the probe board.

In the above probe card, a first capacitor is provided on a surface of the wiring board opposite to the probe board, the second electronic part is a second capacitor with capacitance being less than the first capacitor, and a third capacitor with capacitance being less than the second capacitor is provided on the surface of the probe board including the probes provided thereon.

Another exemplary aspect of the present invention is a testing apparatus including the above probe card and a tester that supplies the probe card with power.

As described above, the present invention can provide a probe card capable of effectively placing the electronic parts.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
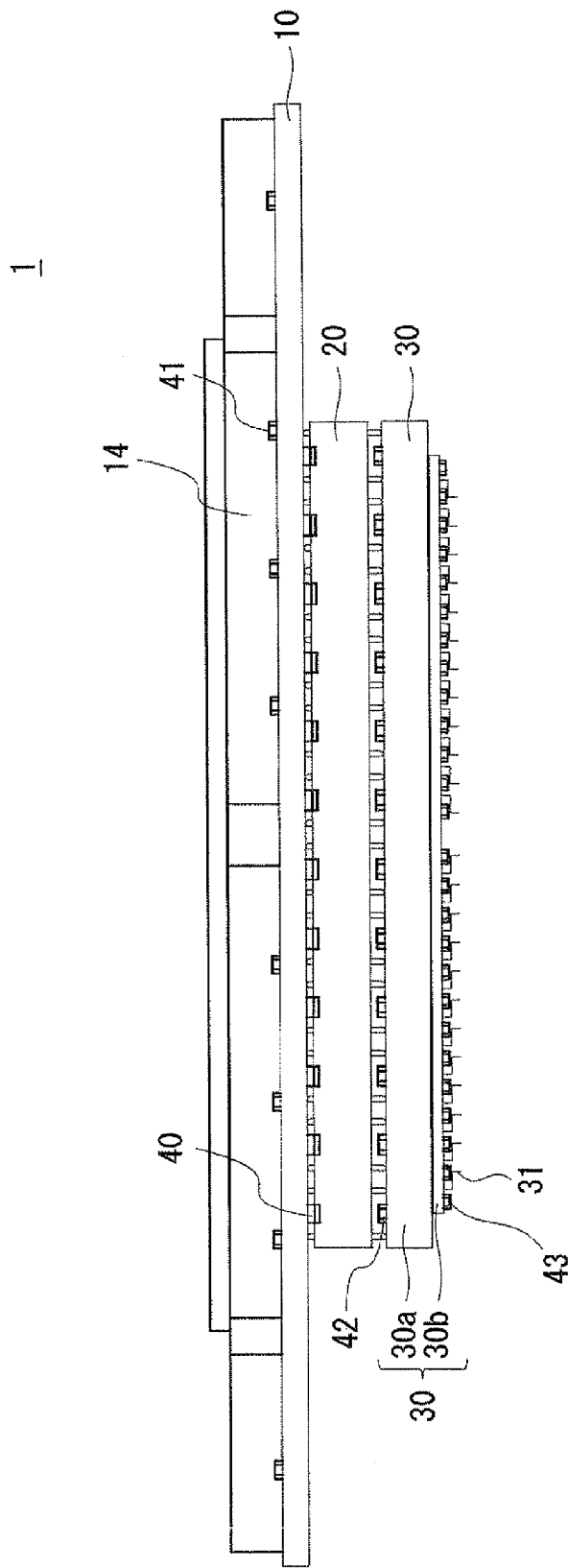
FIG. 1 is a side view showing a configuration of a probe card.

Hereinafter, an exemplary embodiment of the present invention is explained with reference to the drawings. The following explanation illustrates a preferable exemplary embodiment of the present invention, and the present invention shall not be limited to the following exemplary embodiment. In the following explanation, the same reference numerals indicate the substantially same contents.

A probe card and a testing apparatus according to this exemplary embodiment attempt to improve the efficiency upon testing a device under test such as an IC (Integrated Circuit) chip on a semiconductor wafer. In a purpose to improve the efficiency of measurement, an improvement is made to the probe card to compensate for the lack of power supply channels upon testing a number of devices under test simultaneously. Specifically, the improvement is for a circuit part mounted on the probe card. Accordingly, the present invention can be applied to the probe cards in general, and also to all the testing apparatuses using such probe cards. As the present invention can be applied to various probe cards and testing apparatuses, the following explanation focuses on a circuit configuration part mounted on the probe card. An IC chip is explained as an example of the device under test, in which a number of the IC chips are formed on a semiconductor wafer.

The probe card and the testing apparatus according to the present invention include an automatic switching mechanism that, when a faulty chip is included in a plurality of IC chips under test, automatically separates the faulty chip from a power supply channel. The automatic switching mechanism automatically separates the faulty chip from the power supply channel independent of the tester. Then, only normal chips are connected to the power supply channels to which the plurality of IC chips including the faulty chip have been connected so as to measure the normal chips.

Switch control of the power supply channels is separated from the tester to be independent. Specifically, the probe card includes the automatic switching mechanism that makes independent evaluation to switch the power supply channels. This increases the number of IC chips under test simultaneously without increasing the number of control channels for switching while improving yield rate. The following is an explanation of the probe card and the testing apparatus according to this exemplary embodiment.

The testing apparatus of this exemplary embodiment branches each power supply channel into a plurality of power supply channels on the probe card and connects the power supply channels to a plurality of IC chips to supply test power. In the apparatus that measures a plurality of IC chips simultaneously, a probe card can include a detection function that detects a failure in the IC chip under test and interrupts test power supply to the faulty IC chip. The circuit on the probe card of this testing apparatus includes an element that interrupts the test power supply. When a faulty chip is present, the test power supply applied to the faulty chip is interrupted. This eliminates influence by a power supply failure and the like on other chips branched from the power supply channel that is common with the faulty chip. Note that the test power supply refers to various kinds of power supplies that are applied to electrodes of the IC chip through probes such as driving power supply for driving the IC chip under test to conduct a test, a test signal and the like.

Hereinafter, the exemplary embodiment of the present invention is explained with reference to the drawings. FIG. 1 is a side view showing a configuration of the probe card according to this exemplary embodiment. As shown in FIG. 1, the probe card 1 includes a wiring board 10, a connector 20, a probe board 30, relay switches 40, first capacitors 41, second capacitors 42, and third capacitors 43.

The probe board 30 has a laminate composed of a ceramic board 30a and a thin-film multilayer board 30b, for example. The thin-film multilayer board 30b is bonded to a lower surface of the ceramic board 30a. A plurality of probes 31 are provided on a lower surface of the thin-film multilayer substrate 30b. The probes 31 project downward from the probe board 30. Then, the probes 31 come into contact with terminals of the IC chip and the like under test (hereinafter referred to as a device). The probe board 30 has lines to be connected to the probes 31.

A connector 20 is provided above the probe board 30. The connector 20 is placed facing the probe board 30. The connector 20 has connection pins and a holder. The connection pins connect the probe board 30 and the wiring board 10. The holder holds the plurality of connection pins 21 between the wiring substrate 10 and the probe substrate 30. An outer diameter of the connector 20 is comparable to an outer diameter of the probe board 30. The configuration of the connector 20 is explained later.

The wiring board 10 is provided above the connector 20. The wiring board 10 acts as an interface to the tester. The wiring board 10 is a Printed Circuit Board (PCB) on which a plurality of lines are provided. For example, a multilayer board that connects between layers by IVH (Interstitial Via Hole) can be used as the wiring board 10. The wiring board 10 is placed facing the connector 20. The connector 20 is placed between the wiring board 10 and the probe board 30. That is, the wiring board 10 and the probe board 30 are placed facing each other with the connector 20 interposed therebetween. A horizontal outer diameter of the wiring board 10 is greater than the outer diameters of the connector 20 and the probe board 30.

Figure 2:
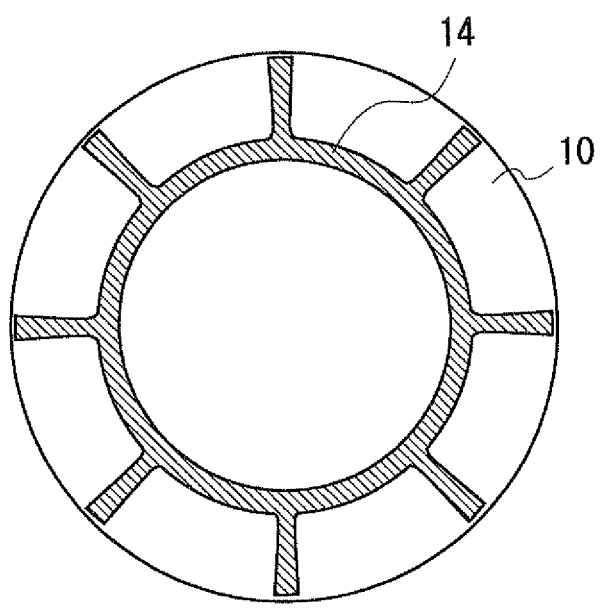
FIG. 2 is a top view showing a configuration of a stiffener.

A stiffener 14 is provided on an upper surface of the wiring board 10. The stiffener 14 acts as a rib to improve stiffness of the probe card 1. The stiffener 14 can suppress variations in the height of the probes 31. The planar shape of the stiffener 14 is shown in FIG. 2. FIG. 2 is a top view showing a configuration of the stiffener 14. The stiffener 14 is placed partially on the upper surface of the wiring board 10.

As shown in FIG. 1, the plurality of first capacitors 41 are mounted on the upper surface of the wiring board 10. Here, a plurality of devices correspond to one first capacitor 41. The plurality of second capacitors 42 are mounted on the upper surface of the probe board 30. The second capacitor 42 corresponds one-to-one to the device. A plurality of third capacitors 43 are mounted on a lower surface of the probe board 30. The third capacitor 43 corresponds one-to-one to the device. That is, the number of the second capacitors 42 and the third capacitors 43 is same as the number of the devices under test.

The plurality of relay switches 40 are mounted on a lower surface of the wiring board 10. The number of relay switches 40 corresponds to the number of devices under test. That is, the number of relay switches 40 is same as the number of devices under test. The tester (not shown in FIG. 1) controls the relay switches 40 to be turned on and off, thereby controlling the power supply to the devices. Specifically, when the relay switch 40 is turned on, the test power is supplied to the device, while when the relay switch 40 is turned off, the power supply to the device is interrupted. The relay switch 40 provided for each device allows independent control of the power supply to each one of the plurality of devices. Upon detection of a failure in power supply current, the faulty chip is separated from the power supply channel. Then, only normal chips are connected to the power supply channel to which the plurality of IC chips including the faulty chip are connected, so as to test the normal chips.

Figure 3:
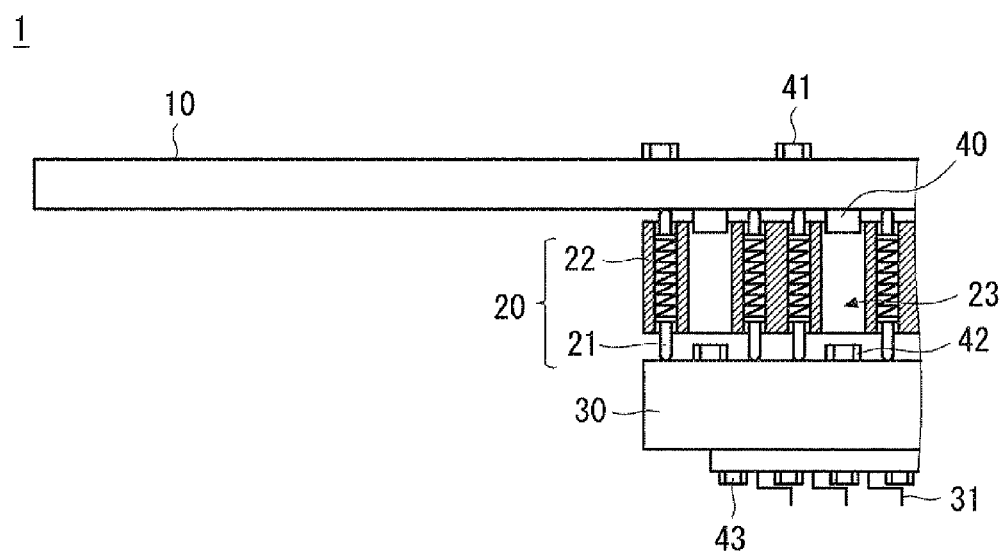
FIG. 3 is a side view showing an enlarged part of the probe card.

Next, a structure of the connector 20 is explained using FIG. 3. FIG. 3 is a cross-sectional view schematically showing a part of the enlarged structure of the connector 20. Note that the stiffener 14 is not shown in FIG. 3. As shown in FIG. 3, the connector 20 includes the connection pins 21 and a holder 22. The connection pins 21 and the holder 22 are placed between the wiring board 10 and the probe board 30.

The holder 22 is a planar member that is positioned between the wiring board 10 and the probe board 30. The holder 22 has through holes for holding the connection pins 21. The connection pin 21 is inserted into the through hole of the holder 22 and protrudes upward and downward from the holder 22. The holder 22 holds the connection pins 21 between the wiring board 10 and the probe board 30. The plurality of connection pins 21 and through holes are provided to correspond to the number of devices under test.

The connection pins 21 are positioned between the wiring board 10 and the probe board 30 and electrically connect the wiring board 10 and the probe board 30. An upper end of the connection pin 21 comes into contact with a pad (not shown) provided on the lower surface of the wiring board 10, and a lower end of the connection pin 21 comes into contact with a pad (not shown) provided on the upper surface of the probe board 30. An outer diameter of the connection pin 21 is 0.4 mm, for example. For example, the connection pin 21 is a pogo pin including a spring. The spring urges the tip of the connection pin 21 to firmly bring the connection pin 21 into contact with the pad. This achieves a stable connection between the wiring board 10 and the probe board 30.

Further, a mounting space 23 for holding the relay switch 40 is provided in the holder 22. For example, the mounting space 23 is formed by providing the through hole in the holder 22. The mounting space 23 is positioned between the adjacent connection pins 21. The size of the mounting space 23 is greater than that of the relay switch 40. The relay switch 40 is placed in the mounting space 23.

Moreover, the second capacitor 42 is placed directly below the relay switch 40. That is, the second capacitor 42 is placed directly below the mounting space 23. The second capacitor 42 and the relay switch 40 are placed facing each other with the mounting space 23 interposed therebetween.

Figure 4:
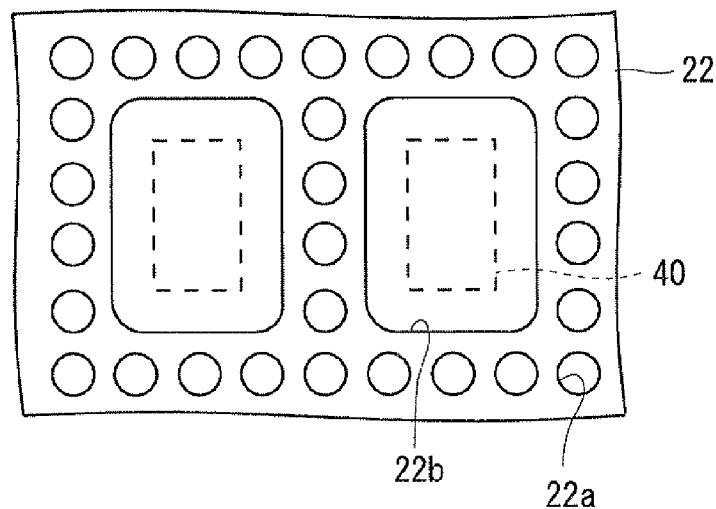
FIG. 4 is a plan view showing a simplified configuration of a holder.

FIG. 4 is a top view showing an enlarged part of the holder 22. FIG. 4 is a top view of a simplified configuration of the holder 22. As shown in FIG. 4, the holder 22 has through holes 22a and through holes 22b. The through hole 22b is slightly larger than the relay switch 40 and is substantially rectangular here. The above-mentioned mounting space 23 is formed by the through hole 22b. That is, the relay switch 40 is placed inside the through hole 22b. The plurality of through holes 22b are provided to correspond to the number of relay switches 40.

The through hole 22a is circular with its outer diameter substantially being the same as the outer diameter of the connection pin 21. As mentioned above, the connection pin 21 is inserted inside the through hole 22a. The plurality of through holes 22a are provided to correspond to the number of connection pins 21. The through holes 22a are arranged to surround the through holes 22b.

The through hole 22b provided in the holder 22 in this way forms the mounting space 23. The space for placing the relay switch 40 can be formed on the lower surface of the wiring board 10. Moreover, the mounting space 23 is provided to the region where the connection pin 21 is not placed. For example, the mounting space 23 is provided at the position where the second capacitor 42 is placed. This realizes efficient use of the limited space. That is, the mounting space 23 is formed in an extra space where the connection pin 21 cannot be placed because the second capacitor 42 is placed. The relay switch 40 can be formed in this extra space. Therefore, the electronic parts can be placed more effectively. Alternatively, the second capacitor 42 can also be placed in the mounting space 23.

Figure 5:
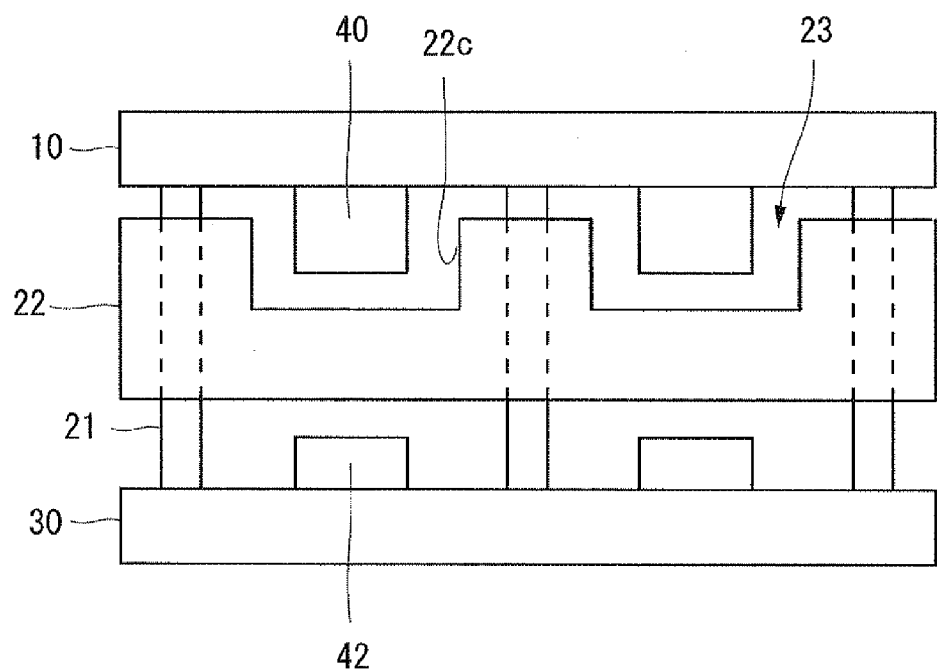
FIG. 5 is a side cross-sectional view schematically showing a modification of a mounting space.

Note that in the above explanation, the mounting space 23 is formed by the through hole 22b, however a recess 22c may be formed in the holder 22 as shown in FIG. 5. Note that FIG. 5 is a side view schematically showing a configuration of forming the mounting space 23 by the recess 22c. For example, the recess 22c can be formed by counterboring. A counterbore hole provided corresponding to the height of the second capacitor 42 realizes improvement in the stiffness of the holder 22. The mounting space 23 can be provided by processing a part of the holder 22. Note that the second capacitor 42 is placed directly below the mounting space 23 also in the configuration shown in FIG. 5.

As described above, in this exemplary embodiment, the mounting space 23 is formed in the holder 22. This achieves efficient use of the space on the lower surface of the wiring board 10. The space directly above the second capacitor 42 is usually an extra space where no connection pin 21 is present. This extra space can be utilized by providing the mounting space 23 directly above the second capacitor 42. Therefore, the electronic parts can be placed effectively. It is obvious that other electronic parts such as a chip resistor can be placed in addition to the capacitor and relay switch.

Figure 6:
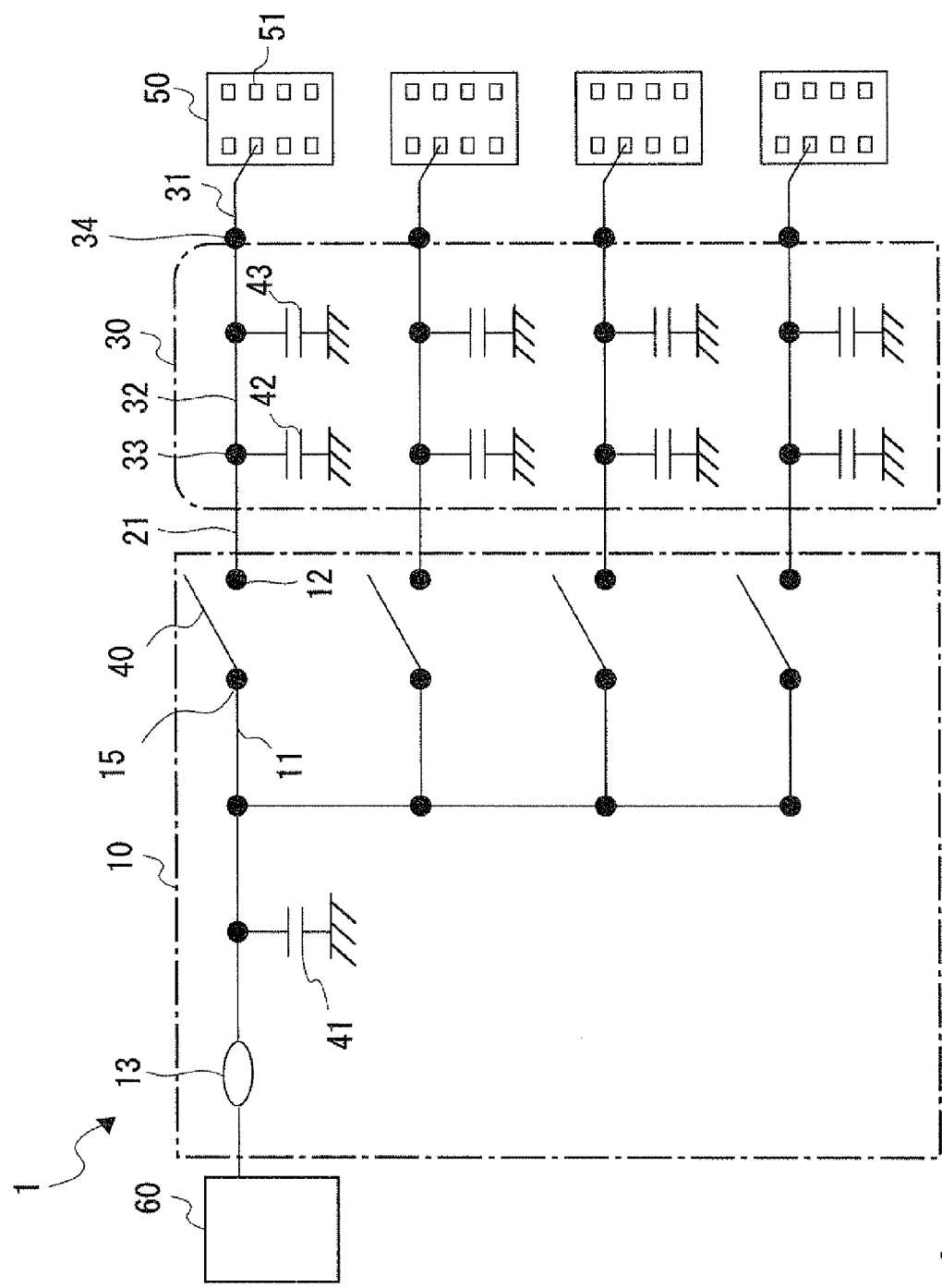
FIG. 6 is a diagram for explaining a configuration of a power supply circuit of the probe card.

Next, the configuration of the power supply circuit for testing that is provided on the probe card 1 is explained using FIG. 6. FIG. 6 is a circuit diagram schematically showing a circuit for testing. Moreover, FIG. 6 shows a configuration example in which four devices are connected to one power supply system.

Lines 11, pads 12, pads 15, and a tester land 13 are formed on the wiring board 10. The tester land 13 is formed on the upper surface of the wiring board 10 and connected to a tester 60. Then, the tester land 13 is connected to the line 11 provided on the wiring board 10. Moreover, the lines 11 are connected to the pads 15. The pads 12 and pads 15 are electrode pads formed on the lower surface of the wiring board 10. Therefore, the lines 11 include through lines that penetrate through the wiring board 10. The relay switches 40 are placed between the pads 15 and the pads 12.

Here, four relay switches 40 are connected to one first capacitor 41. That is, one end of the first capacitor 41 is connected to the tester land 13, and four lines 11 that are branched from one end of the first capacitor 41 is respectively connected to the relay switches 40. Note that an example is illustrated here in which one power supply system tests four devices 50, thus one first capacitor 41 is connected to four relay switches 40. It is obvious that the number of relay switches 40 corresponding to one first capacitor 41 is not especially limited. For example, one relay switch 40 may be connected to one first capacitor 41, or two or more relay switches 40 may be connected to one first capacitor 41.

The pads 12 is also an electrode pad to be in contact with one end of the connection pin 21. The connection pin 21 and the line 11 are connected through the pad 12. Moreover, the other end of the connection pin 21 comes into contact with a pad 33 provided on the probe board 30. The pad 33 is an electrode pad to be in contact with the other end of the connection pin 21. The probe board 30 includes lines 32, the pads 33, and pads 34. Further, the second capacitors 42 and the third capacitors 43 are mounted on the probe board 30.

The lines 32 are connected to the pads 33 and the pads 34. The pads 33 are electrode pads provided on the upper surface of the probe board 30. The pads 34 are electrode pads provided on the lower surface of the probe board 30. Therefore, the lines 32 include through lines that penetrate through the probe board 30. The second capacitor 42 and the third capacitor 43 are connected in parallel between the line 32 and the ground.

The probes 31 are connected to the pads 34. The probes 31 come into contact with electrodes 51 of the device 50. When the relay switch 40 is turned on, the tester 60 is electrically connected to the electrode 51 of the device 50. Then, the test power from the tester 60 is supplied to the device 50. The power supply from the tester 60 to the device 50 is interrupted by turning off the relay switch 40. The relay switch 40 is controlled by a control signal from the tester 60, for example. This enables the relay switch 40 to be turned on and off at a desired timing. It is possible to continue testing the devices 50 in the same system as the faulty device 50.

Next, capacitance of the first capacitor 41, the second capacitor 42, and the third capacitor 43 is explained. For example, the first capacitor 41 is a bypass capacitor with capacitance of 10 μF or more. Specifically, the first capacitor 41 can be a chip capacitor of 47 μF, 39 μF, or 10 μF. One end of the first capacitor 41 is connected to the ground, and the other end of the first capacitor 41 is connected to the line 11 of the wiring board 10.

The second capacitor 42 is a bypass capacitor with capacitance between 1 μF and 10 μF. Specifically, the second capacitor 42 can be a chip capacitor of 4.7 μF, 2.2 μF, or 1.0 μF. One end of the second capacitor 42 is connected to the ground, and the other end of the second capacitor 42 is connected to the line 32 of the probe board 30.

The third capacitor 43 is a bypass capacitor with capacitance below 1 μF. Specifically, the third capacitor 43 can be a chip capacitor of 0.1 μF, 22 μF, or 10 μF. One end of the third capacitor 43 is connected to the ground, and the other end of the third capacitor 43 is connected to the line 32 of the probe board 30.

The bypass capacitor can maximize its (charge and discharge) capabilities when the bypass capacitor is placed as close as possible to the device 50. However, the space near the device 50 is limited. For example, the probe 31 is placed on the lower surface of the probe board 30. Therefore, the bypass capacitors must be placed on the lower surface of the probe board 30 such that the bypass capacitors do not interfere the probe 31. Further, on the lower surface of the probe board 30, it is necessary to place capacitors with their height being less than the height of the probe 31. For example, the size of the capacitor that can be placed on the lower surface of the probe board 30 is 1.0 mm×0.6 mm or less.

Moreover, the second capacitors 42 must be placed on the upper surface of the probe board 30 such that the second capacitors 42 do not interfere the connection pins 21 and the holder 22. For example, the height of the second capacitor 42 needs to be less than or equal to the gap (about 2 mm) between the holder 22 and the probe board 30. The size of the second capacitor 42 that can be placed on the upper surface of the probe board 30 is 2.0 mm×1.25 mm or less. Note that when the mounting space 23 is formed by the through hole 22b, the second capacitor 42 can be placed in the mounting space 23, thereby allowing a large size second capacitor 42 to be used. There is no limitation on the height of capacitors on the upper surface of the wiring board 10, thus a capacitor with a large size, for example 3.0 mm×1.25 mm, can be placed.

The greater the capacitance of the capacitor, the greater the size of the capacitor. Therefore, capacitors can be placed such that the capacitance of the capacitors will be small, medium, and large from the closest to furthest capacitors from the device 50, thereby enabling the capacitors to be effectively placed. For example, when the first capacitors 41 on the upper surface of the wiring board 10 have small capacitance, deterioration of characteristics becomes apparent as the first capacitors 41 are distant from the device 50. As the upper surface of the wiring board 10 has little limitation on the space, a large size capacitor can be placed.

The third capacitors 43 placed on the lower surface of the probe board 30 shall have capacitance less than the second capacitors 42 and the first capacitors 41. The first capacitors 41 placed on the upper surface of the wiring board 10 shall have capacitance greater than the second capacitors 42 and the third capacitors 43. The second capacitors 42 placed on the upper surface of the probe board 30 shall have capacitance less than the first capacitor 41 and also greater than the third capacitor 43. It is then possible to place the bypass capacitors in such a manner that the closer the bypass capacitor to the device under test 50, the smaller the capacitance of the bypass capacitor.

Figure 7:
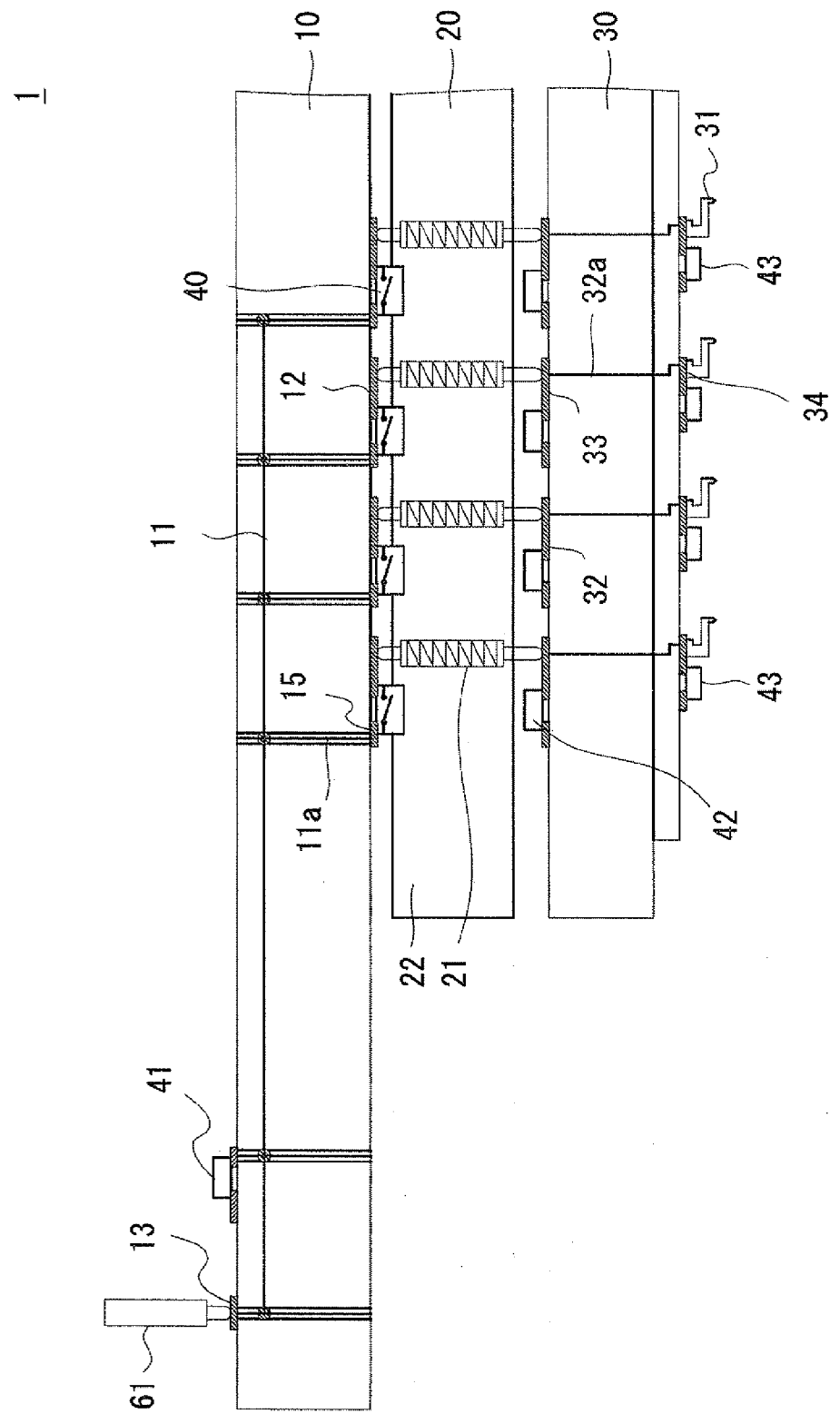
FIG. 7 is a diagram showing the power supply circuit of the probe card.

Next, FIG. 7 shows a circuit diagram of the probe card 1 according to this exemplary embodiment. FIG. 7 partially shows a circuit of the probe card 1. As shown in FIG. 7, the tester land 13 is placed on the upper surface of the wiring board 10. The tester land 13 is placed on an outer periphery of the wiring board 10. Further, a tester pin 61 of the tester 60 is in contact with the tester land 13. The tester pin 61 supplies the test power to the tester land 13. The lines 11 are provided on the wiring board 10. The lines 11 include through lines 11a that penetrate through the wiring board 10. Moreover, a part of the lines 11 acts as the tester land 13.

The lines 32 are formed on the probe board 30. The lines 32 include through lines 32a that penetrate through the probe board 30. Moreover, a part of the lines 32 acts as the pad 33 and the pad 34. The pads 33 are formed on the upper surface of the probe board 30, and the pads 34 are formed on the lower surface of the probe board 30.

Wiring connection from the tester land 13 to the probes 31 is explained below. The tester land 13 and the first capacitor 41 are connected through the line 11 provided on the wiring board 10. Specifically, the first capacitor 41 is connected to the relay switch 40 through the through line 11a that penetrates the wiring board 10. Here, the first one capacitor 41 is connected to four relay switches 40 in a similar manner as in FIG. 6.

The relay switches 40 are connected to the lines 11 provided on the lower surface of the wiring board 10. A part of the lines 11 provided on the lower surface of the wiring board 10 acts as the pad 15. The pad 15 is connected to one end of the relay switch 40. The pad 12 is connected to the other end of the relay switch 40. The pad 12 comes into contact with and electrically connected to the connection pin 21. The relay switch 40 is mounted close to the corresponding connection pin 21. Therefore, the line length from the relay switch 40 to the connection pin 21 can be short.

The lower end of the connection pin 21 comes into contact with and electrically connected to the pad 33 provided on the upper surface of the probe board 30. The pad 33 has become a part of the line 32 provided on the upper surface of the probe board 30. Moreover, the pad 33 is connected to the second capacitor 42. The lines 32 include the through lines 32a that penetrate through the probe board 30. Further, the pad 33 provided on the upper surface of the probe board 30 and the pad 34 provided on the lower surface of the probe board 30 are connected through the through line 32a. The probes 31 are mounted on the pads 34. The probe 31 is electrically connected to the line 32 through the pad 34 provided on the lower surface of the probe board 30. The line 32 on the lower surface of the probe board 30 is connected to the third capacitor 34.

The relay switches 40 are mounted on the lower surface of the wiring board 10 as described above. This achieves efficient use of the space and effective placement of the electronic parts such as the relay switches 40, the first capacitors 41, the second capacitors 42, the third capacitors 43. This reason is explained below.

Figure 8:
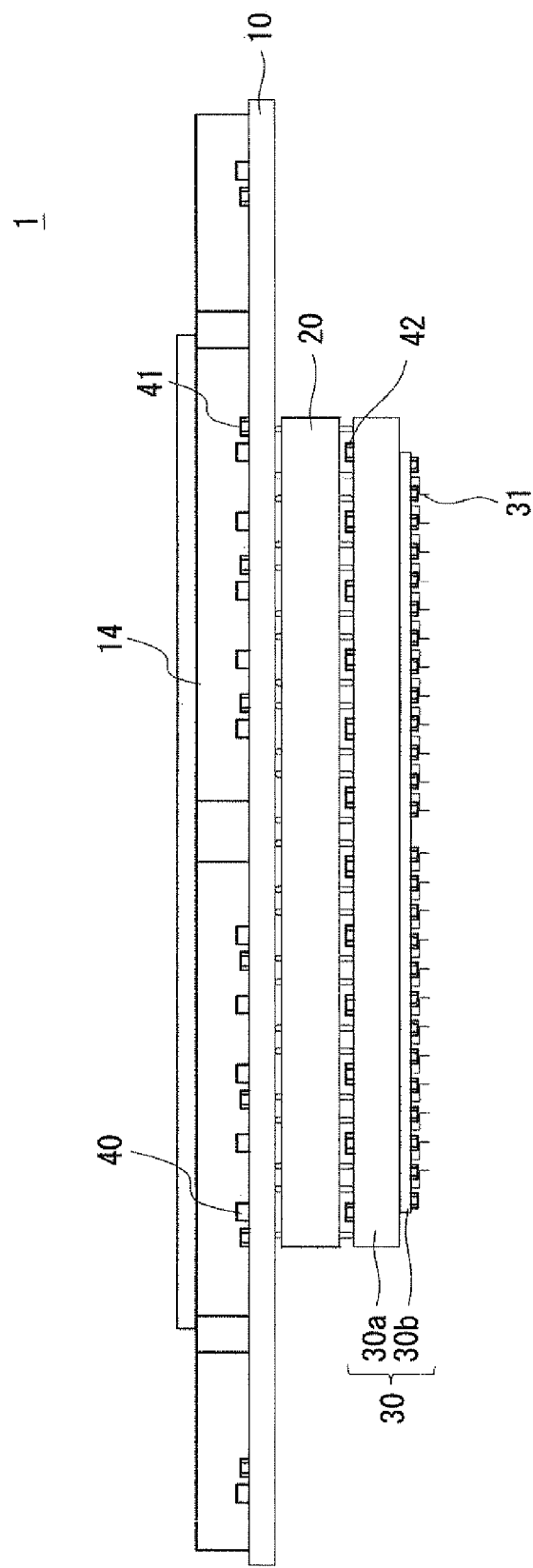
FIG. 8 is a side view showing a configuration of a probe card according to a comparative example.
Figure 9:
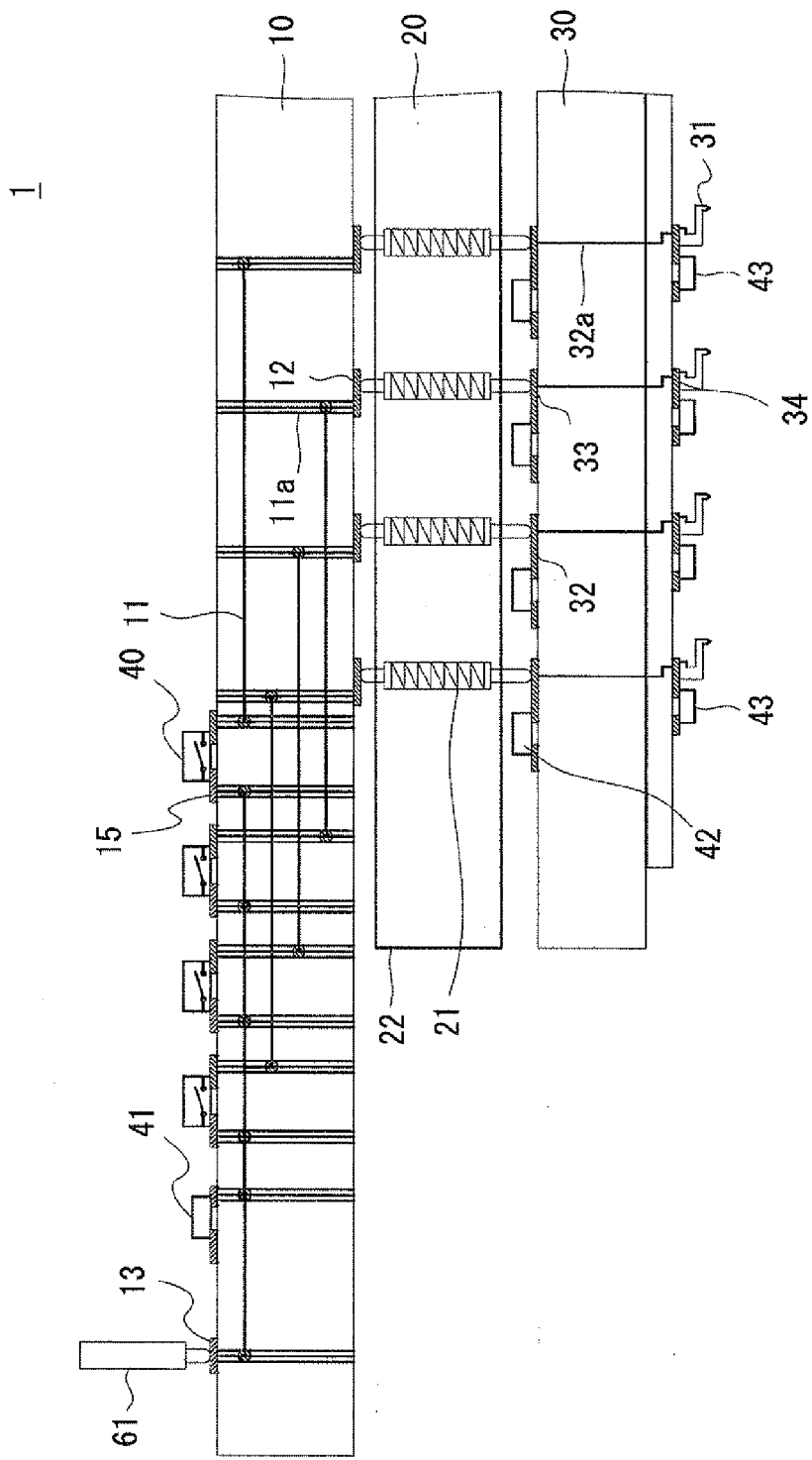
FIG. 9 is a diagram of the probe card according to the comparative example.

Here, FIGS. 8 and 9 show a configuration of a comparative example in which the relay switches 40 are mounted on the upper surface of the wiring board 10. FIG. 8 is a side view showing a configuration of a probe card, and FIG. 9 is a circuit diagram showing a circuit configuration of the probe card.

In the comparative example, as shown in FIG. 8, the relay switches 40 are formed on the upper surface of the wiring board 10. However, the stiffener 14 is provided on the upper surface of the wiring board 10, thus the space for placing the relay switches 40 is limited. The relay switch 40 cannot be placed at a position where the stiffener 14 is present.

For this reason, the line length of the probes 31 differs from each other on the wiring board 10. For example, as for the probe 31 directly below the stiffener 14, the relay switch 40 cannot be placed directly above the probe 31, thus the length of the probe 31 on the wiring board 10 will be long. Further, less relay switches can be disposed on the upper surface of the wiring board 10.

Here, an example is explained in which the device 50 under test (DUT) is DRAM (Dynamic Random Access Memory). An outer diameter of the probe card 1 is 480 mm. The number of devices under test (the number of DUT) is 1426. The same number of relay switches 40 as the number of DUT are provided on the wiring board 10. The number of tester power supplies is 384. That is, the number of the first capacitors 41 is 384.

In this case, the number of lines from the relay switches 40 to the connection pins 21 is 1426. The number of lines from the tester land 13 to the first capacitors 41 is 384. Therefore, it is necessary to place a total of 1810 (=1426+384) power supply lines on an inner layer of the probe board 30. Increase in the number of inner layer lines requires the lines to be narrowed.

Narrower line width of the power supply lines leads to an increase in the inductance and power supply noise. Thus, in the comparative example of FIGS. 8 and 9, there is a possibility that the inductance and the power supply noise increase. The greater the number of DUT, the greater the number of relay switches 40, thereby making it difficult to route the power supply lines on the wiring board 10.

In the probe card according to this exemplary embodiment, the relay switches 40 are provided on the lower surface of the wiring board 10, as shown in FIG. 7. This therefore simplifies the lines 11 from the first capacitors 41 to the relay switches 40. For example, it is not necessary to connect the lines 11 provided on the inner layer of the probe board 30 to the relay switches 40 on the upper layer of the probe board 30. Moreover, since the lines 11 from the first capacitor 41 to the through lines 11a can be shared more widely, the lines on the wiring board 10 can be simplified. Thus, the number of the wiring layers in the wiring board 10 can be reduced. Moreover, reduction in the number of wiring layers leads to reduction in the manufacturing cost of boards and reduction in the design time.

The line width of the power supply lines can be increased, thereby reducing wiring resistance values. This further prevents a voltage drop associated with an increase in the wiring resistance values and generation of ground bounce associated with the increase in the inductance. Further, as the relay switch 40 is placed close to the connection pin 21, the line length from the relay switch 40 to the connection pin 21 can be extremely short. As there is no limitation on the space that is imposed by the stiffener 14 on the lower surface of the probe board 30, the relay switch 40 can be placed appropriately. This achieves suppression of variations in the line length from the device 50 to the bypass capacitor. That is, the line length from the device 50 to the bypass capacitor can be close to be equivalent. This enables effective placement of the electronic parts and prevents deterioration in the electrical characteristics.

Although the above explanation illustrated a configuration of mounting the capacitors and relay switches on the probe board 30 and the connector 20, other electronic parts may be mounted.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A probe card comprising:
    a plurality of probes that come into contact with a plurality of electrodes of a device under test;
    a probe board that includes the plurality of probes provided thereon;
    a wiring board that is placed facing a surface of the probe board opposite to a surface including the probes provided thereon;
    a connector that includes a connection pin and a holder, the connection pin electrically connecting a line of the probe board and a line of the wiring board, and the holder holding the connection pin between the probe board and the wiring board; and
    a first electronic part that is mounted on a probe board side-facing surface of the wiring board that is opposite an upper surface of the wiring board and placed in a mounting space on the probe board side surface of the wiring board, the mounting space being formed where the connection pin is not placed, to enable space-efficient placement of the first electronic part in a manner that substantially prevents deterioration in electrical characteristics of the first electronic part and makes additional space available on the upper surface of the wiring board, the mounting space being formed by a through hole or a recess provided in the holder.

2. The probe card according to claim 1, wherein the first electronic part is a relay switch that interrupts power supply to the device under test.

3. The probe card according to claim 1, wherein a second electronic part is mounted at a position facing the first electronic part on a wiring board side surface of the probe board.

4. The probe card according to claim 3, wherein
    a first capacitor is provided on a surface of the wiring board opposite to the probe board,
    the second electronic part is a second capacitor with capacitance being less than the first capacitor, and
    a third capacitor with capacitance being less than the second capacitor is provided on the surface of the probe board including the probes provided thereon.

5. The probe card according to claim 1, wherein a first capacitor is provided on a surface of the wiring board opposite to the probe board, and the first capacitor is connected to a plurality of the first electronic parts.

6. A testing apparatus comprising:
    the probe card according to claim 1; and
    a tester that supplies the probe card with power.

7. The probe card of claim 5, wherein the first electronic part comprises a relay switch configured to interrupt a power supply to the device under test.

* * * * *